United States Patent
Surdon et al.

(10) Patent No.: US 9,081,047 B2
(45) Date of Patent: Jul. 14, 2015

(54) METHODS, DEVICE AND INSTALLATION FOR LOCATING A DEFECT IN AN ELECTRIC LINK

(71) Applicant: RTE EDF TRANSPORT, Paris la Defense Cedex (FR)

(72) Inventors: Matthieu Surdon, Paris (FR); Christian Aucourt, Marcq en Bareuil (FR); Xavier Bourgeat, Chatou (FR)

(73) Assignee: RTE RESEAU DE TRANSPORT D'ELECTRICITE, Paris la Defense (FR)

( * ) Notice: Subject to any disclaimer, the term of this patent is extended or adjusted under 35 U.S.C. 154(b) by 0 days.

(21) Appl. No.: 14/013,764

(22) Filed: Aug. 29, 2013

(65) Prior Publication Data

US 2014/0005962 A1 Jan. 2, 2014

Related U.S. Application Data

(62) Division of application No. 12/867,788, filed as application No. PCT/FR2009/050373 on Mar. 6, 2009, now Pat. No. 8,554,499.

(51) Int. Cl.
*G01F 17/00* (2006.01)
*G01R 31/11* (2006.01)
*G01R 31/08* (2006.01)

(52) U.S. Cl.
CPC .............. *G01R 31/11* (2013.01); *G01R 31/085* (2013.01); *G01R 31/088* (2013.01)

(58) Field of Classification Search
None
See application file for complete search history.

(56) References Cited

U.S. PATENT DOCUMENTS

| 6,320,367 B1 | 11/2001 | Cuzin et al. | |
|---|---|---|---|
| 2008/0048669 A1* | 2/2008 | Scherber et al. | 324/534 |
| 2010/0109679 A1* | 5/2010 | Frech et al. | 324/628 |

OTHER PUBLICATIONS

S.H. Francis, Magnetic Localization of Buried Cable by the Scarab Submersible, Jun. 19, 1980, The Bell System Technical Journal vol. 60, No. 4, Apr. 1981, p. 535-574.*

* cited by examiner

*Primary Examiner* — Aditya Bhat
(74) *Attorney, Agent, or Firm* — Oblon, McClelland, Maier & Neustadt, L.L.P.

(57) ABSTRACT

A method for locating a defect in an electric link includes measuring at least one part of components of an electromagnetic field in a vicinity of an estimated location of the defect at plural places along the link; deducing, via a processor, from the measuring an estimation of variation of at least the part of the components of the electromagnetic field along the electric link in a vicinity of the estimated location of the defect; and estimating, via the processor, a new location of the defect as a function of the estimated variation of at least the part of the components of the electromagnetic field.

6 Claims, 6 Drawing Sheets

METHODS, DEVICE AND INSTALLATION FOR LOCATING A DEFECT IN AN ELECTRIC LINK

This application is a divisional of U.S. Ser. No. 12/867,788, now U.S. Pat. No. 8,554,499, filed Aug. 16, 2010, the entire content of which is incorporated herein by reference, and claims priority under 35 U.S.C. 119 to International Application No. PCT/FR09/050373 filed Mar. 6, 2009 and European Application No. 08290221.4 filed Mar. 7, 2008.

The invention relates to methods, a device and an installation for locating a defect in an electric link. Electric link is taken to mean a link comprising an electric cable or a plurality of interconnected electric cables.

BACKGROUND OF THE INVENTION

The invention applies particularly to the location of defects in cables for transmitting electrical energy in links including for example undersea and/or underground electric cables, for which it is difficult to intervene and thus necessary to obtain a precise and reliable location.

More specifically, the invention particularly relates to a method comprising the steps consisting in transmitting, at a first moment, an electric signal having a predetermined propagation speed at the start from an end of the electric link and in detecting, at a second moment, the reception of an echo of said electric signal.

DESCRIPTION OF THE PRIOR ART

Such a method is described in the French patent application published under the number FR 2 784 192. In this document, the described method is presented as applying particularly to telecommunication network cables. A pulsed signal is firstly emitted at a first end of a cable having a defect. Then successive echoes, due to the multiple reflections of the pulsed signal on the defect after several to and fro cycles between the first end and the defect, are received and displayed on the screen of an oscilloscope. At constant propagation speed V, if the return of the first echo is detected at the end of a time t following the transmission of the pulsed signal, the length L of cable traversed between the first end of the cable and the defect is deduced from this, by means of the following proportionality relation:

$$L = \frac{V}{2} t.$$

On the oscilloscope, the axis of abscissas may thus be directly graduated in meters instead of microseconds given that the propagation speed of the pulsed signal along the cable is known. Indeed, according to a property advantageously exploited in this document, the internal characteristics of the telecommunications network cable comprising the defect are very homogeneous over its whole length and the external medium does not have any influence on the propagation inside the cable, so that the propagation speed of the pulsed signal in the cable may be considered a known and constant. Thus, an operator is capable of reading directly on the oscilloscope, without additional computation, the distance L between the first end of the cable and the defect.

Unfortunately, this method, applied to the location or to the pre-location of defects in electrical energy transmission links, particularly insulated undersea or underground power cables, or instead a combination of these two types of cables, does not give a precise result. It has thus been observed that the locating error may attain more than one kilometer for an undersea cable of less than fifty kilometers. This is very detrimental since, precisely for this type of cables, the length of which is often counted in tens of kilometers, the difficulty in intervening to repair a defect requires a high reliability of the result.

It may therefore be desirable to overcome this drawback by proposing a method for locating defects ensuring a correction aimed at a better precision.

SUMMARY OF THE INVENTION

An object of the invention is thus a method for locating a defect in an electric link comprising the steps consisting in:
transmitting, at a first moment, an electric signal having a predetermined propagation speed at the start from an end of the electric link,
detecting, at a second moment, the reception of an echo of said electric signal,
characterised in that it further comprises the steps consisting in:
establishing a model of the variation of the electric signal propagation speed in the electric link as a function of the length of electric link through which the signal has flowed,
estimating a location of the defect as a function of the difference between the first and second moments, of the predetermined propagation speed, and of the speed variation model in the link.

It has indeed been noticed that the propagation speed of the pulsed signal in certain cables, although known at the transmission, cannot be considered as constant, particularly due to dielectric losses in an insulator of these cables: this is in particular the case of all cables known as "insulated" for transmitting electrical energy. This variation of the propagation speed explains thus the error in result provided by a conventional method, independently of a reading error by the operator that is always possible. Taking into account a model of the variation of the electric signal propagation speed in a considered electric link then makes it possible to correct this error and to provide a satisfactory location or pre-location of the defect.

According to one embodiment, a method according to the invention further comprises a step consisting in defining, by means of the model of the variation of the electric signal propagation speed in the electric link, a correspondence table between, on the one hand, difference values between the first and second moments and, on the other hand, assumed distances from the defect to a reference point of the electric link.

According to one embodiment, the model of the variation of the electric signal propagation speed in the electric link is a model with dielectric loss factor and with dielectric permittivity of an insulator of the link that are variable as a function of a frequency of the signal, and consequently of the length of the electric link through which the signal has flowed, inducing a reduction in the propagation speed of the signal.

According to one embodiment, the reception, at the second moment, of the echo of the electric signal is determined when the amplitude of this echo attains a predetermined percentage, particularly ten percent, of its maximum amplitude. This facilitates the reading and thus improves the precision of the detection of the reception.

Another object of the invention is a device for locating a defect in an electric link, intended to be connected to one end of the electric link, comprising:

a signal generator for the transmission, at a first moment, of an electric signal having a predetermined propagation speed at the start from one end of the electric link, a signal receptor for the detection, at a second moment, of the reception of an echo of said electric signal, characterised in that it further comprises:

means for storing data from a model of the variation of the electric signal propagation speed in the electric link as a function of the length of link through which the signal has flowed, a computer configured to estimate a location of the defect by means of the stored data, as a function of the difference between the first and second moments, of the predetermined propagation speed at the start, and of the speed variation model in the link.

A further object of the invention is an installation for locating a defect in an electric link, comprising an electric link having a defect and two locating devices according to the invention connected respectively to two different ends of the link.

Finally, a yet further object of the invention is a method for locating a defect in an electric link, characterised in that it comprises the steps consisting in:

measuring at least one part of the components of an electromagnetic field in the vicinity of an estimated location of the defect at several places along the link, deducing from this an estimation of the variation of at least this part of the components of the electromagnetic field along the electric link in the vicinity of the estimated location of the defect, estimating a new location of the defect as a function of the estimated variation of at least this part of the components of the electromagnetic field.

According to one embodiment, a method according to the invention further comprises the steps consisting in:

measuring, by means of a system with three mutually orthogonal coils, the complete module of the electromagnetic field in the vicinity of the estimated location of the defect at several places along the link, deducing from this an estimation of the variation of the complete module of the electromagnetic field along the electric link in the vicinity of the estimated location of the defect, estimating a new location of the defect as a function of the detection of an inflexion point in the estimated variation of the complete module of the electromagnetic field along the link.

According to one embodiment, the measurements, at several places along the link, of at least a part of the components of the electromagnetic field are carried out along a path constituted of successive transversal passages directly above the link, particularly along a boustrophedon course.

According to one embodiment, the measured electromagnetic field is generated by the flow in the electric link of a current of predetermined frequency and the measured part of the components of the electromagnetic field is filtered by means of a band-pass filtering system regulated around this predetermined frequency of the current.

BRIEF DESCRIPTION OF THE DRAWINGS

The invention will be better understood on reading the following description, given purely by way of example, and by referring to the appended drawings, among which.

DESCRIPTION OF THE PREFERRED EMBODIMENTS

Figure 1:
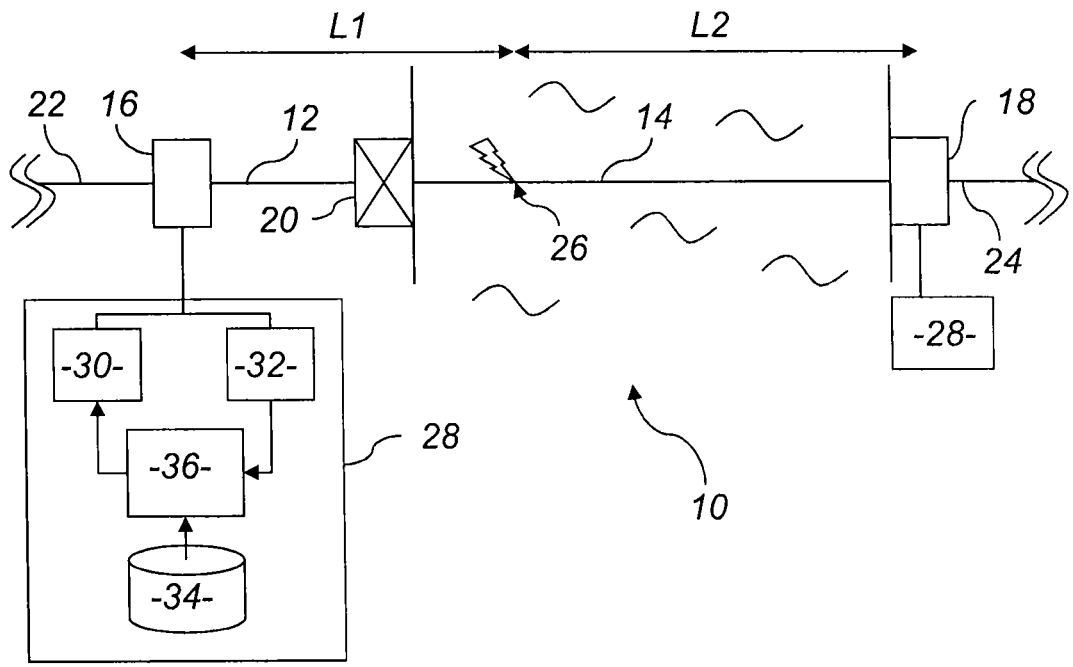
FIG. 1 represents schematically and partially the structure of an installation for the transmission of electrical energy, by underground and undersea insulated cables, provided with devices for locating a defect according to a first aspect of the invention.

First Aspect of the Invention: Location or Pre-Location of a Defect by Echometry The installation 10 for the transmission of electrical energy of FIG. 1 comprises an electric link comprising two electric cables 12 and 14 connected together end to end. The cable 12 is an underground cable, whereas the cable 14 is an undersea cable. By way of example, in the remainder of the description it will be considered that this installation illustrates schematically and partially a bipole of the IFA2000 link, a first end 16 of which, known as Sellindge end, is situated in Great Britain and the second end 18 of which, known as Sangatte end, is situated in France. The cables 12 and 14 are interconnected by means of a junction 20, known as Folkestone junction, situated in Great Britain. In reality, a bi-pole of the IFA2000 link comprises two pairs of cables such as the assembly constituted of cables 12 and 14, but the simplified representation of FIG. 1 suffices to understand the principle of the invention.

The undersea cable 14, of a length of around 44.6 kilometers, links the Sangatte end 18 to the Folkestone junction 20. The underground cable 12, of a length of around 18.5 kilometers, links the Folkestone junction 20 to the Sellindge end. These cables 12 and 14 make it possible to link two networks 22, 24 for transmitting and distributing electrical energy in Great Britain and in France.

When a defect 26 appears in one of the cables 12 or 14, here the undersea cable 14, at a distance L1, along the cable, from the Sellindge end 16 and L2 from the Sangatte end 18, a method for locating this defect consists in injecting a pulsed signal into the electric link and detecting the return of an echo of said signal after reflection on the defect. Since the Folkestone junction cannot be opened, it is possible to inject this pulsed signal uniquely from the Sellindge end 16 or Sangatte end 18.

To do this, at least one locating device 28 is connected to the installation, either at the level of the Sellindge end 16, or at the level of the Sangatte end 18, or at each of these two ends. In the example illustrated by FIG. 1, two locating devices 28 are connected respectively to the two ends 16 and 18.

Each of these locating devices comprises:
- a signal generator 30 for the transmission, at a first moment, of an electric signal at predetermined propagation speed Vo at the start from an end 16 or 18 of the assembly of cables 12, 14,
- a signal receptor 32 for the detection, at a second moment, of the reception of an echo of said electric signal at this same end 16 or 18,
- means 34 of storing data from a model of the variation of the electric signal propagation speed in all of the cables 12, 14 as a function of the length of cable through which the signal has flowed, and
- a computer 36, configured to estimate a location of the defect 26 by means of the stored data, as a function of the difference between the first and second moments, of the predetermined propagation speed and of the model of the variation of the speed in the assembly of cables 12, 14.

The assembly constituted of the means of storage 34 and of the computer 36 may in practice be a simple computer capable of controlling the generator 30 and processing signals provided by the receptor 32. The assembly constituted of the generator 30 and the receptor 32 may in practice be a conventional echometer. Thus, each locating device 28 may be constituted of an echometer controlled by a computer.

Figure 2:
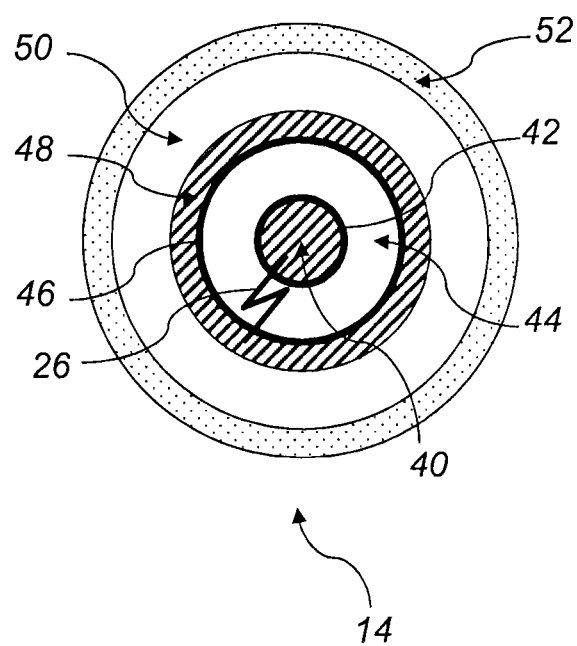
FIG. 2 represents schematically and in section an undersea insulated cable for the transmission of electrical energy having a defect.

In FIG. 2, the undersea cable 14, of generally cylindrical shape, is represented in section at the level of the defect 26. It comprises a conducting core 40, for example made of copper, surrounded by an internal semi-conductor 42, then an insulator 44 constituted, for the IFA2000 link, of oil impregnated paper tapes. The insulator 44 is itself also surrounded by an external semi-conductor 46. The internal semi-conductor 42 is for example constituted of carbon filled paper tapes and the external semi-conductor 46 of textile tape with interwoven metal wires.

This assembly is surrounded by a conductive screen 48, for example made of lead, then a sheath 50, then finally a steel armour 52 for the mechanical resistance and protection of the cable 14.

It will be noted that the cable represented in FIG. 2 is presented in a purely illustrative and non-limiting manner. The invention applies to any type of electric cable known as "insulated", including those that do not have armour.

The defect 26 appears when the insulator 44 no longer correctly ensures its function, so that part of the transmitted current passes between the conducting core 40 and the screen 48. This axial passage of current burns the insulator 44 and then creates a short-circuit between the core and the screen.

It is this short-circuit that produces an impedance singularity, enabling the location of the defect 26 by echometry.

Although the propagation speed Vo of a pulsed signal at the start from an end 16 or 18 of the assembly of cables 12, 14 is known, considering that this speed is the constant propagation speed of the signal between the end and the defect, then, after reflection, between the defect and the end, leads to measurement errors. Indeed, such a simplification assumes that the dielectric losses are negligible, but also that the dielectric loss factor and the dielectric permittivity of the insulator 44 are independent of the frequencies of the spectrum of the pulsed signal.

Yet an analytical study, correlated with measurements carried out on the cables 12 and 14, shows that the dielectric loss factor of the insulator 44 varies with the frequency of the signal, such that a pulsed signal undergoes distortions through variable losses on its frequential components. The table below gives the characteristics of the cables 12 and 14.

|  | Cable 14 | Cable 12 |
| --- | --- | --- |
| Diameter on conductor (mm) | 35 | 40.2 |
| Resistivity of the conductor ($\Omega \cdot m$) | $1.7241 \cdot 10^{-8}$ | $1.7241 \cdot 10^{-8}$ |
| Diameter of the central channel (mm) |  | 20 |
| Diameter on exterior screen (mm) | 68.8 | 67.8 |
| Thickness of the screen (mm) | 3.2 | 3.1 |
| Resistivity of the screen ($\Omega \cdot m$) | $21.4 \cdot 10^{-8}$ | $21.4 \cdot 10^{-8}$ |
| Loss factor ($\times 10^{-4}$) as a function of the frequency expressed in kHz |  |  |
| $10^{-2}$ | 20.9 | 19.5 |
| $3.2 \cdot 10^{-2}$ | 27.6 | 26.4 |
| $10^{-1}$ | 30.4 | 31.0 |
| $3.2 \cdot 10^{-1}$ | 32.4 | 39.9 |
| 1 | 36.7 | 65.7 |
| 3.2 | 49.3 | 144.4 |
| 10 | 86.8 | 348.8 |
| 32 | 166.4 | 690.2 |
| $10^2$ | 253.5 | 921.7 |
| $3.2 \cdot 10^2$ | 300.0 | 851.6 |
| $10^3$ | 311.8 | 566.4 |
| $3.2 \cdot 10^3$ | 291.3 | 331.3 |
| $10^4$ | 226.1 | 179.4 |
| $3.2 \cdot 10^4$ | 139.2 | 89.9 |
| $10^5$ | 74.1 | 50.1 |
| $3.2 \cdot 10^5$ | 41.5 | 34.2 |
| $10^6$ | 24.7 | 23.4 |

Furthermore, measurements carried out on the cables 12 and 14 also show that the dielectric permittivity of the insulator 44 varies in a correlated manner with the loss factor. In fact, during its propagation in the cables 12 and 14, a signal loses its components at high frequencies, in such a way that the response of the dielectric is not constant as a function of the distance through which the signal has flowed. In particular, the dielectric losses decrease with the distance through which the signal has flowed, but correlatively the dielectric permittivity of the insulation increases inducing, at the same time, a reduction in the propagation speed of the signal.

An estimation of the variation of the propagation speed of a signal as a function of the distance covered, in the cables 12 and 14, may be carried out by a purely analytical study, followed by a numerical resolution according to a chosen representation, for example a Laplace or Fourier representation.

The purely analytical approach makes it possible to bring out the physical aspects of the propagation of the spectral components of a signal in a cable. It highlights the role of the inductance L and the leakance G of the cable in the attenuation of the signal. This attenuation results in a delay in the arrival of an echo of said signal compared to a signal that propagates in a medium without losses.

According to this study, the response $\sigma(x, t)$ of a cable, at a distance x from the origin of the transmission and after a time t, to a signal may be considered as the sum over the whole range of frequencies or pulsations $\omega$ (from 0 to $\infty$) of particular sinusoidal solutions $v(\omega)$ of the equation of telegraphy. If the constants R, L, C and G of the cable are considered independent of the frequency, the response $\sigma(x,t)$ of the cable then comprises a frontal wave and a signal tail, each spectral component not propagating with the same speed w(ω). The components v(ω) in which the frequencies are the highest form a packet of waves that propagate at a limit speed W defined by $$W = \frac{1}{\sqrt{LC}}$$

and constitute the frontal wave. This frontal wave reproduces without deformation, but with an attenuation, the emitted signal. However the constants R, L and G of the cable vary with the frequency. In particular, the variation of R and L with the frequency gives rise to a residual wave in the frontal wave, which thus no longer reproduces the emitted signal. It is the backflow of the current at the surface of the conductors, at high frequencies, that is physically at the origin of this.

The response σ(x, t) of the cable, limited to the frontal wave, is then defined by an expression of the type:

$$\sigma(x, t) = A \cdot e^{-a\theta} \cdot [\text{erfc}\chi(t) - \gamma(t - t_0) \cdot \text{erfc}\chi(t - t_0)], \text{ with } \chi(t) = \sqrt{\frac{\tau}{2t}}, \quad (1)$$

where τ is a time constant, and where the function erfc is the complementary error function defined by $$\text{erfc}(z) = \frac{2}{\pi} \int_0^z e^{-t^2} dt.$$

The leakance G merges with the conductance of dielectric losses, i.e. $G = C\omega \text{tg}(\delta)$. It contributes to considerably diminishing the contribution of the high frequency components at the echo formation of the signal and results in an apparent delay of the arrival of the echo equal to $$\left(\frac{tg(\delta)}{2}\right) \cdot \theta_0.$$

However, the effects linked to the leakance G and to the inductance L of the cable cannot, alone, take account of the measurable effective variations of the propagation speed in the cable. In accordance with measurements carried out, a postulate is established to model the propagation of the signal, consisting in taking into account the link necessary between the variations, with the frequency, of the dielectric loss factor tg(δ) of the insulator 44, and of its dielectric permittivity ∈r, in a numerical resolution of the analytical model described above, making it possible to access the shape and the characteristics of the echo and to take account of the signal propagation speed. Two possible numerical approaches, one according to a Laplace representation, the other according to a Fourier representation, make it possible to resolve the analytical model and provide slightly different results, to be compared with the measurements.

Figure 3A:
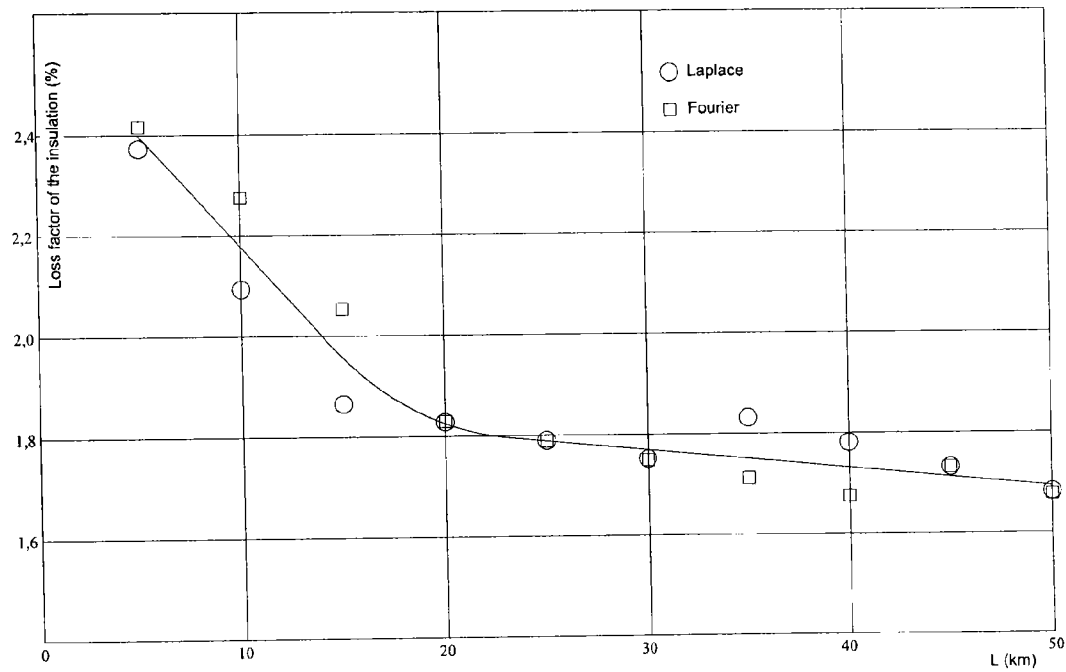
FIGS. 3a and 3b illustrate graphically the correlated variations of a dielectric loss factor and a dielectric permittivity in the cables of FIG. 1 as a function of the distance covered by a signal in these cables.
Figure 3B:
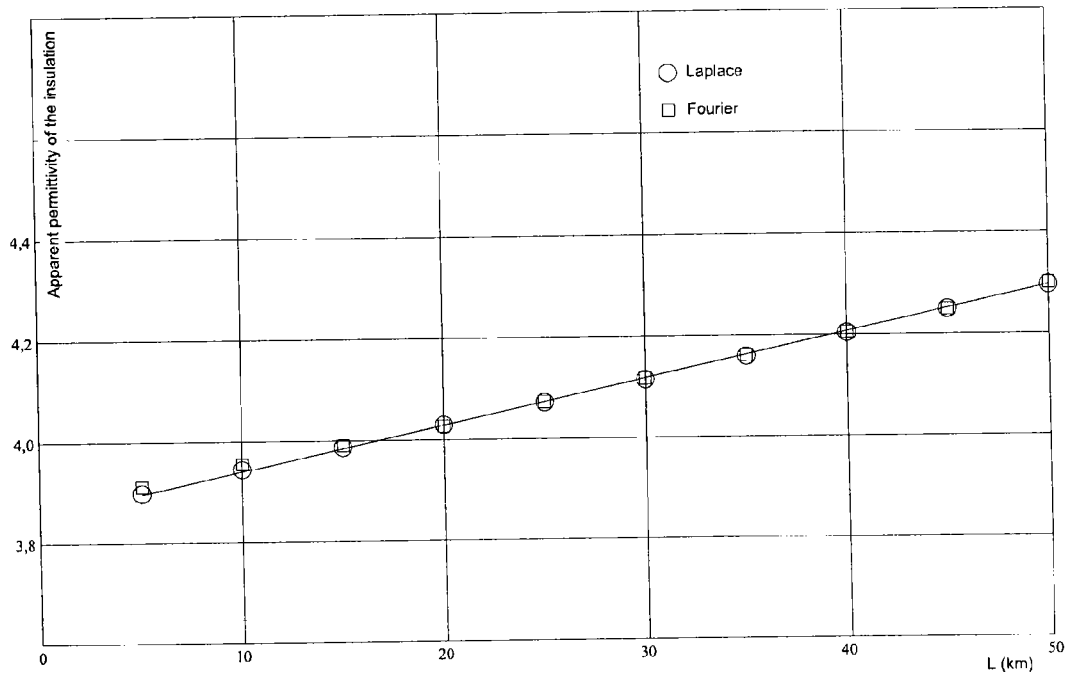

The results of the numerical analysis give particularly a quantitative support to the variations in the dielectric loss factor tg(δ) of the insulator and its dielectric permittivity ∈r with the distance L covered by the signal, represented in FIGS. 3*a* and 3*b* for the undersea cable 14, the Sangatte end 18 defining the origin of the transmissions. It will be noted that, if the Laplace and Fourier representations lead to the same estimations of variation of the dielectric permittivity of the insulator as a function of the distance covered by the signal, it is not completely the same for the estimations of the variation of the dielectric loss factor tg(δ).

Figure 4A:
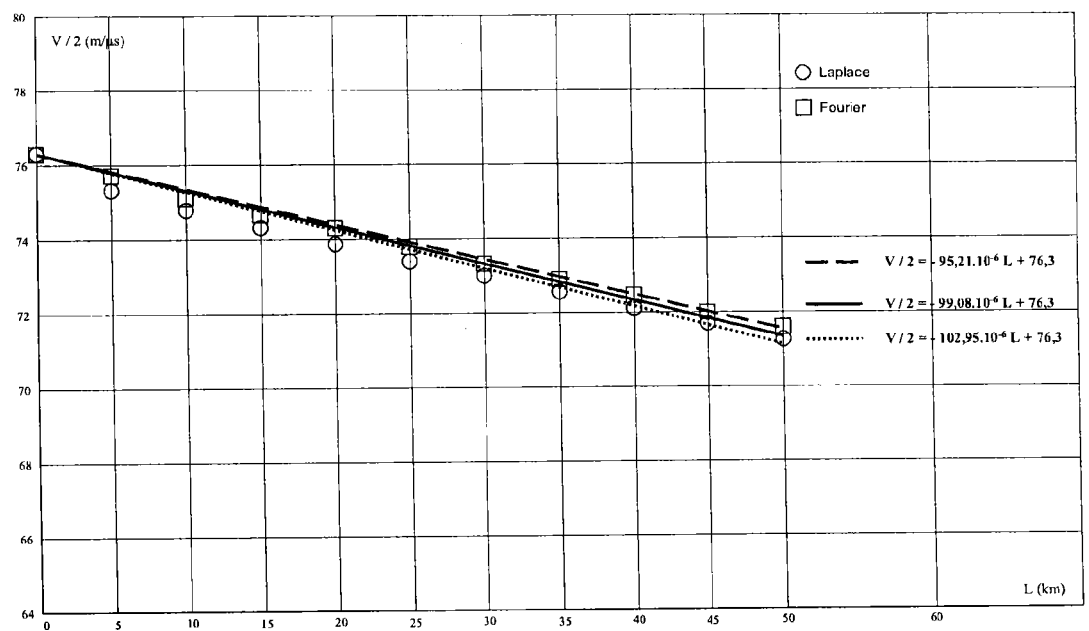
FIGS. 4a and 4b illustrate graphically several simplified models of the variation of the electric signal propagation speed in the cables of FIG. 1 as a function of the length of cable through which the signal has flowed.

Several possible models of the variation of the propagation speed V in the undersea cable 14 ensue, as is represented in FIG. 4*a*. For example, a first model, that using a Laplace representation, is illustrated by values identified by circles and is linearly reduced along a straight line with short continuous lines. A second model, that using a Fourier representation, is illustrated by values identified by squares and is linearly reduced along a straight line with long broken lines. A third model, resulting from measurements carried out on the cable 14, is illustrated by a straight line with a continuous line. The propagation speed at the transmission in the undersea cable 14, 152.6 m/μs, is known and is common to the three models. The slopes of the three straight lines are similar, testifying to the convergence of the Laplace and Fourier analytical approaches, as well as the pertinence of the postulate according to which the variations, with the frequency, in dielectric loss factor tg(δ) of the insulator 44 and its dielectric permittivity ∈r are linked.

Figure 4B:
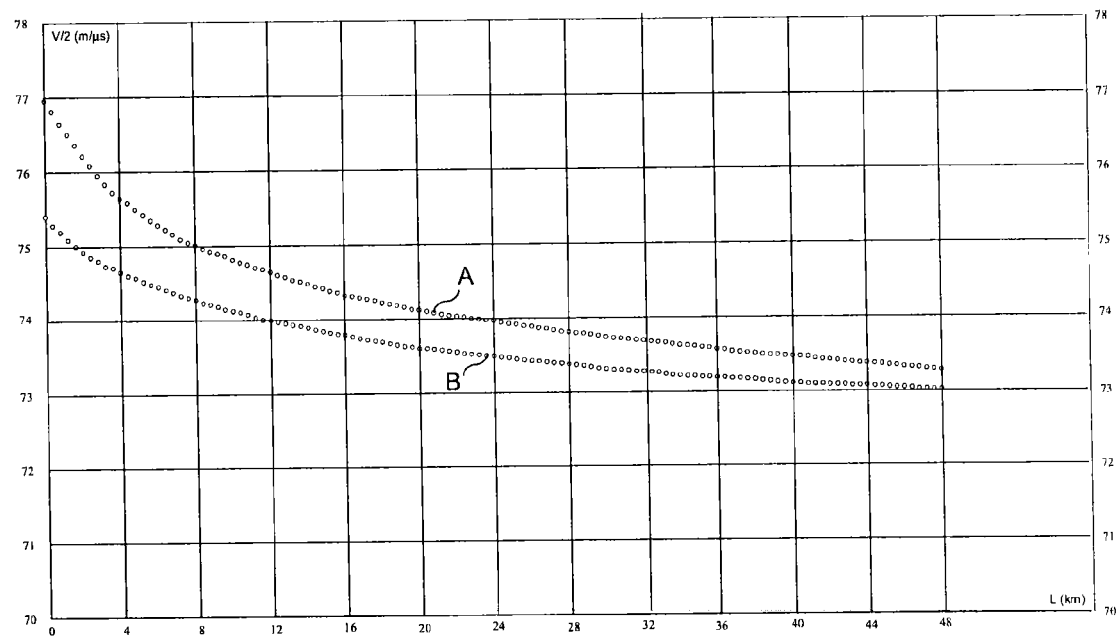

In FIG. 4*b*, the two Laplace and Fourier formalisms having given converging results visible in FIG. 4*a*, the equation of telegraphy is treated uniquely according to the Fourier formalism, by including a model of the variation of losses and permittivity of the insulator 44 with the frequency and thus as a function of the distance covered by a signal, in two situations of measurement by echometry:

a measurement by echometry from the Sangatte end 18 (curve A), and a measurement by echometry from the Sellindge end 16, including the presence of two types of cables 12 and 14 (curve B).

It will be noted that the effective speed of the signal and its echo after reflection on the defect 26 are deduced, by the equation of telegraphy, from the calculation of the time θ of their propagation between the measurement device 28 and the defect, the length L of the cable being known by hypothesis.

Figure 5:
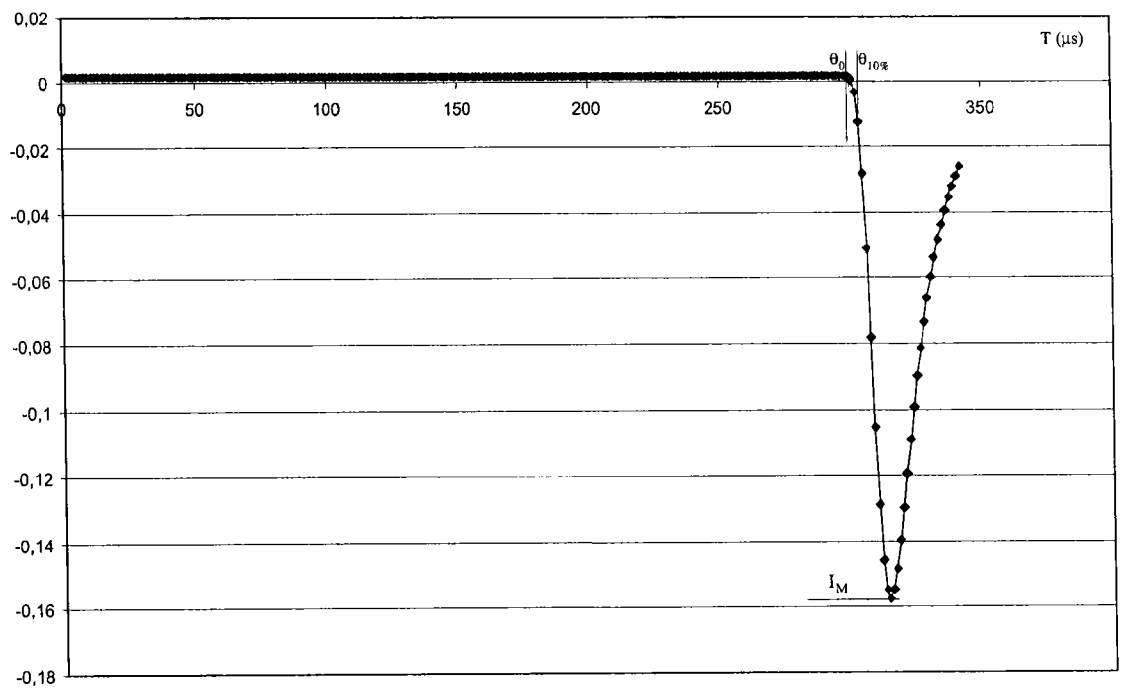
FIG. 5 illustrates graphically the general appearance of an echo of electric signal detected at one end of the cables of FIG. 1.

The propagation time is the time interval between the transmission of the signal marked by its wave front with low rise time, and the reception of its echo on the defect, for example marked by the foot θ0 of the "head of signal" with a rise time several orders of magnitude higher. The foot of the echo θ0 presents a locating difficulty, due to the high attenuation of the components of higher rank of the signal and its echo on the defect. It may however be marked by the study of data relative to the amplitude of the echo, particularly the variation of curvature of the representative curve. As an alternative, the propagation time may be measured at the level of the abscissa at 10% of maximum amplitude of the echo, noted $\theta_{10\%}$ as is represented in FIG. 5. The model of the variation of the propagation speed is obviously dependent on the reference mark chosen.

In returning to a linear model of variation of the propagation speed, as illustrated in FIG. 4*a*, the following relation is admitted:

$$V/2 = V_0/2 - L/\tau \quad (2)$$

The general relation is deduced from this giving the distance, along the cable, of the defect compared to the measurement point as a function of the measured propagation time θ:

$$L = \frac{V_0/2}{1/\theta + 1/\tau}, \quad (3)$$

with, for the cable 14, Vo/2=76.3 m/μs and 1/τ=88.0.10-6 μs-1 if θ=θo and 1/τ=99.08.10-6 μs-1 if θ=θ$_{10\%}$ (example of FIG. 4a).

The value of Vo/2 is considered known, in other words without uncertainty. The uncertainty of the relation (3) thus resides in the slope 1/τ and in the measurement θ. The following uncertainty relation is deduced from this:

$$\frac{\Delta L}{L} = \frac{1}{1+\theta/\tau}\left(\frac{\theta}{\tau} \cdot \frac{\Delta \tau}{\tau} + \frac{\Delta \theta}{\theta}\right). \quad (4)$$

The propagation speed models of FIG. 4a are in fact based on a measurement of the propagation time at θ$_{10\%}$ and show that there exists effectively a measurable uncertainty in the slope 1/τ in addition to the uncertainty on the measurement θ. This uncertainty may be increased, according to the measurements and numerical resolutions of FIG. 4a by the following value:

$$\frac{\Delta \tau}{\tau} = 3.903\%. \quad (5)$$

Propagation speed models based on a measurement of the propagation time at θo would show that no uncertainty exists in the slope 1/τ and that only uncertainty exists on the measurement in this case.

In the case of measurements at θo, the term $$\frac{\Delta \tau}{\tau}$$

is thus zero and the relation (4) becomes:

$$\frac{\Delta L}{L} = \frac{1}{1+\theta/\tau} \cdot \frac{\Delta \theta}{\theta} \le \frac{\Delta \theta}{\theta},$$

the term θ/τ may be considered as low given 1. Measurements carried out on the cable 14 establish the relative uncertainty $$\frac{\Delta \theta}{\theta}$$

at 1,236%.

In the case of measurements at θ$_{10\%}$, the term $$\frac{\Delta \tau}{\tau}$$

is not zero (it may be increased by the value 3.903%) and, multiplied by θ/τ, is of the order of 0.18%. Thus, if it is assumed that the operator is capable of carrying out a measurement of θ$_{10\%}$ with a relative uncertainty on the reference origin less than or equal to 1%, the choice of this measurement is justified.

According to one embodiment of the invention, for a simple and rapid implementation of the defect 26 locating method, from the relation (3) it is possible to directly construct a correspondence table between the distance L from the defect 26 to a reference point and the total measured to and fro propagation time of the signal emitted and its echo. This table is stored in the storage means 34.

By way of example, for the IFA2000 link, the appended correspondence tables have been conceived:
  table 1: for an echometry carried out from the Sangatte end 18, table 1 gives a correspondence between the distance L from the defect at this Sangatte end and the total to and fro propagation time (by measurement θo or θ$_{10\%}$),
  table 2: for an echometry carried out from the Sellindge end 16, table 2 gives a correspondence between the distance L from the defect at the Folkestone junction 20 and the total to and fro propagation time (by measurement θo or θ$_{10\%}$).

It will obviously be noted that the values given in this table are relative to a fixed predetermined value of the speed Vo of transmission of the signal.

Figure 6:
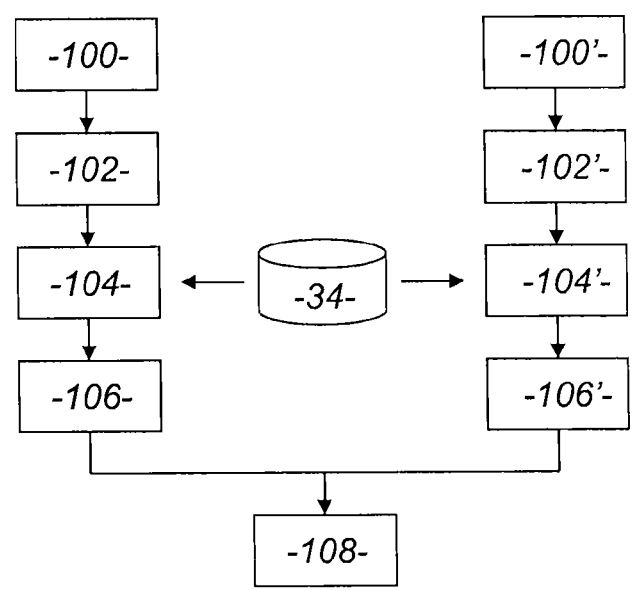
FIG. 6 illustrates the successive steps of a defection locating method according to the first aspect of the invention.

The method for locating the defect 26 illustrated in FIG. 6 is implemented in the installation of FIG. 1.

It comprises a first step 100 of transmission, from a first locating device 28 arranged at the Sangatte end 18, of a pulsed signal at a moment t=0 taken as reference mark of the time axis.

Then, during a second measurement step 102, an echo representative of the reflection of this signal on the defect 26 is detected, either automatically or manually by an operator. The moment θo or θ$_{10\%}$ of reception of this echo is measured, either at the foot of the echo, or at 10% of the maximum amplitude of the echo, as indicated previously.

During a step of estimation 104, the moment of reception of the echo is compared to the values of table 1, in the second or third column depending on the measurement, to deduce from this, by correspondence, a segment of cable 400 meters long in which is located the defect 26 according to the measurement. A more accurate estimation of the position of the defect inside the segment of cable may be obtained by linear interpolation, according to a known calculation, as a function of the ends of this segment of cable and the position of the moment of reception measured in the correspond time segment of table 1.

Finally, during a final step 106, the value estimated for locating the defect is returned.

As an alternative, the location may be carried out from the Sellindge end 16. In this case also, the speed Vo of transmission of the signal is fixed and known.

In this case, the locating method comprises a first step 100' of transmission, from a first locating device 28 arranged at the Sellindge end 16, of a pulsed signal at a moment t=0 taken as reference mark of the time axis.

Then, during a second measurement step 102', an echo representative of the reflection of this signal on the defect 26 is detected, either automatically or manually by the operator. The moment θo or θ$_{10\%}$ of reception of this echo is measured, either at the foot of the echo, or at 10% of the maximum amplitude of the echo, as indicated previously.

During an estimation step 104', the moment of reception of the echo is compared to the values of table 2, in the second or third column depending on the measurement, to deduce from this, by correspondence, a segment of cable 400 meters long in which is located the defect 26 according to the measurement. A more accurate estimation of the position of the defect inside the segment of cable may be obtained by linear interpolation as a function of the ends of this segment of cable and the position of the moment of reception measured in the corresponding time segment of table 2.

Finally, during a final step 106', the value estimated for locating the defect is returned.

As an alternative and optionally, two locating devices may be arranged in the installation 10, each at one end, and the steps 100 to 106 on the one hand, and 100' to 106' on the other hand, may be executed so as to obtain two estimated values for locating the defect 26. In this case, the steps 106 and 106' are followed by an additional step 108 during which a definitive estimation of the location of the defect 26 may be deduced from the two values from steps 106 and 106', with if necessary an uncertainty estimated in the form of a segment of the cable 14.

Second Aspect of the Invention: Location of the Defect by Study of an Electromagnetic Field Directly Above the Defect According to this second aspect of the invention, following for example a pre-location carried out in accordance with the first aspect described previously, in other words for example following step 108, a finer location by studying the variations of the electromagnetic field directly above the undersea cable 14 may be carried out in the vicinity of the segment of cable determined at step 108. Indeed, due to the presence of the defect 26 in the undersea cable 14, an electric signal of current i transmitted at a certain frequency from one end of the cable in the conductive core 40 partially returns to its source, at the level of the defect 26, among others by the sea, thereby creating a dissymmetry between the end of transmission of the current and the defect 26, whereas beyond the defect this dissymmetry no longer exists. Thus, by measuring the electromagnetic field H directly above the cable 14 upstream of the defect 26 (in other words between the transmission end and the defect) and in approaching this defect, the field reduces and is then cancelled out, so that a detection of the location of the defect can take place by detection of the variation then of the cancelling out of the electromagnetic field. The frequency of the electric signal emitted is for example between 25 and 80 Hz, while avoiding frequencies around 50 Hz, which correspond to the normal parasitic frequencies.

Figure 7:
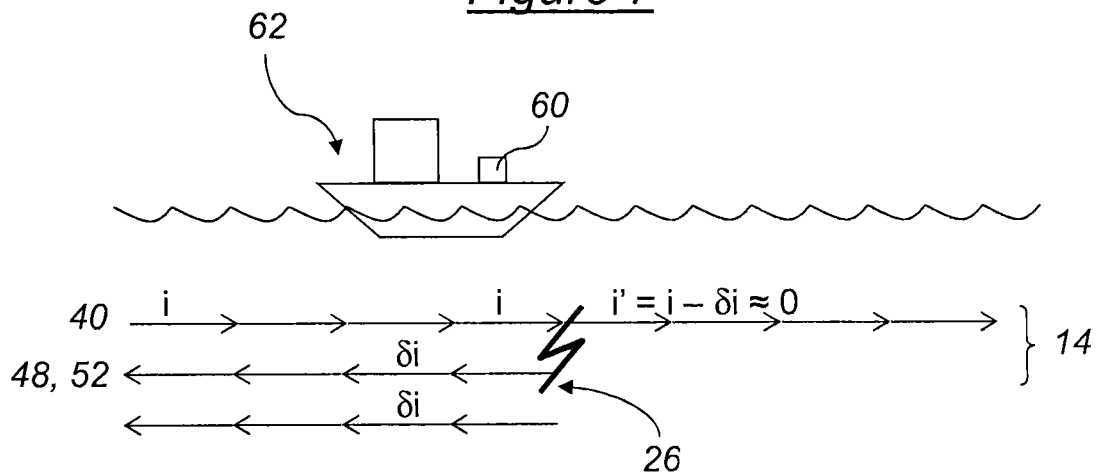
FIG. 7 represents schematically an installation for the implementation of a defect locating method according to a second aspect of the invention.

The implementation of this second aspect of the invention may be carried out by an installation such as that represented in FIG. 7. An electromagnetic field measuring device 60 is arranged on a floating support 62, for example a ship, in the vicinity of directly above the defect 26. The ship 62 moves, if possible along the cable 14, and a measurement of the field is regularly recorded.

Figure 8:
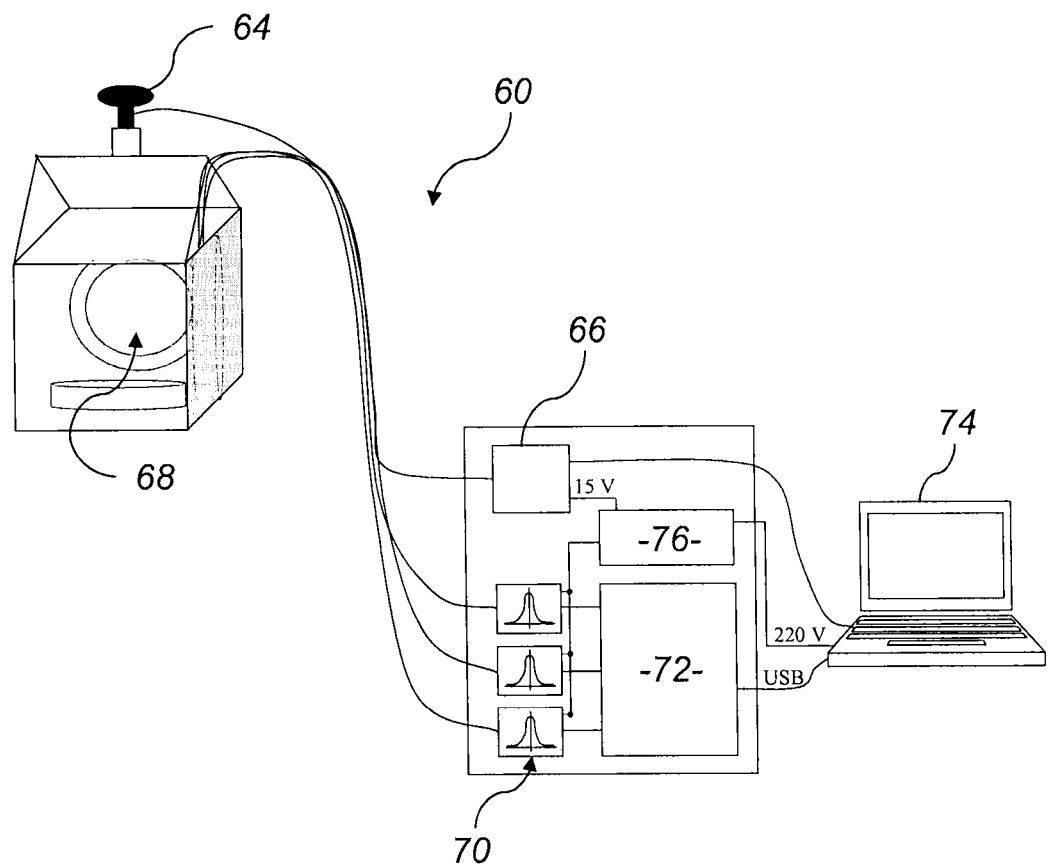
FIG. 8 represents schematically a measurement device of the installation of FIG. 7.

As represented in FIG. 8, the electromagnetic field measuring device 60 comprises a GPS 64 antenna for geographic positioning by satellite connected to a GPS 66 detection box for geographic positioning by satellite. This makes it possible to know at each moment the exact position of the box.

Furthermore, the device 60 comprises 3 mutually orthogonal coils 68, enabling the measurement of three orthogonal components of the electromagnetic field, so as to be able to deduce from this a value of the complete module |H| of the field H, whatever the fluctuations of the ship 62.

The measurements of components of the electromagnetic field by the three coils 68 are subjected to a filtering, by means of three band-pass filters 70 of high order around the frequency of the electric signal transmitted. The result of these filterings is then subjected to a digital acquisition card 72.

The values of geographic positioning of the measuring device and components of the electromagnetic field are transmitted, by the box 66 and by the acquisition card 72, to a computer 74 for the exploitation of these results. It will be noted that, since the device 60 for measuring the electromagnetic field is an on-board system, a supply 76 supplies the box 66, the system of filters 70 and the computer 74 with electrical energy. By means of the three filtered components of the electromagnetic field, the computer reconstitutes a value of the module |H| of this field. If necessary, the computer extracts the vertical component |Hz| of the electromagnetic field if the measurements taken allow it to do so.

Figure 9:
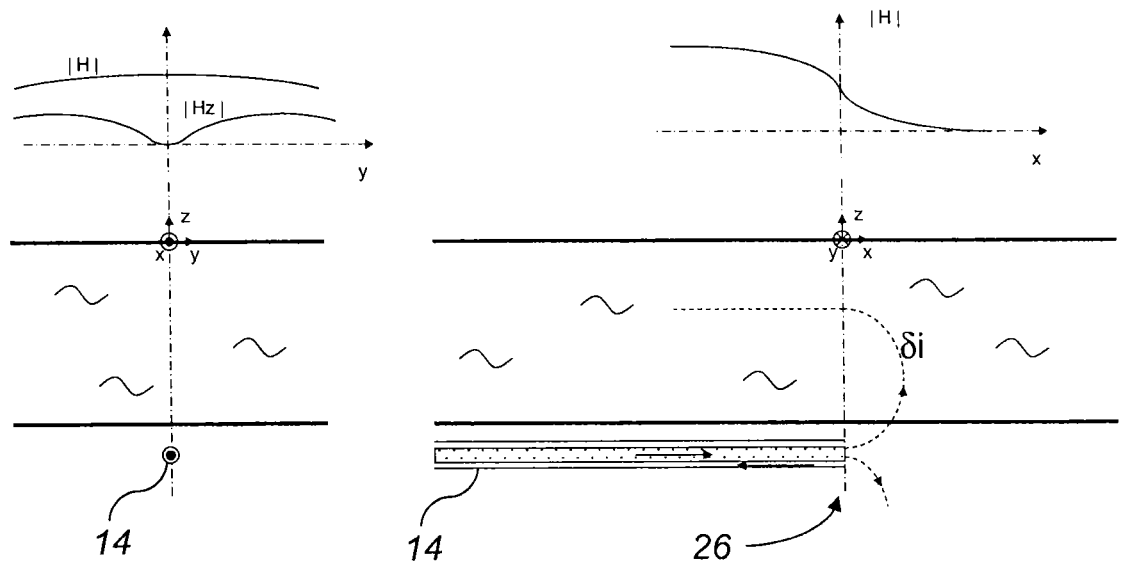
FIG. 9 illustrates graphically a measurement principle implemented by the device of FIG. 8.

The principle for locating the defect 26 implemented by the device 60, and more specifically by the computer 74, is illustrated in FIG. 9. It will be noted that at constant height (z) in relation to the sea bottom, if one moves transversally in relation to the cable 14, the module |H| of the electromagnetic field attains a maximum directly above the cable. On the other hand, its vertical component |Hz| attains a minimum directly above the cable 14. Furthermore, it will be noted that at constant height (z) in relation to the sea bottom, if one moves longitudinally in relation to the cable 14, the module |H| of the electromagnetic field tends to diminish on approaching the defect 26, then to cancel out once the defect is passed. Directly above the defect 26, the curve giving the value of the module of the field along the cable shows an inflexion point that thereby provides a good estimation of the location of the defect 26.

Figure 10:
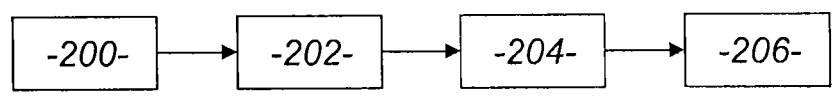
FIG. 10 illustrates the successive steps of the defect locating method implemented by the installation of FIG. 7.

A method for precisely locating the defect 26 in the undersea cable 14, represented in FIG. 10, is deduced from this.

Figure 11:
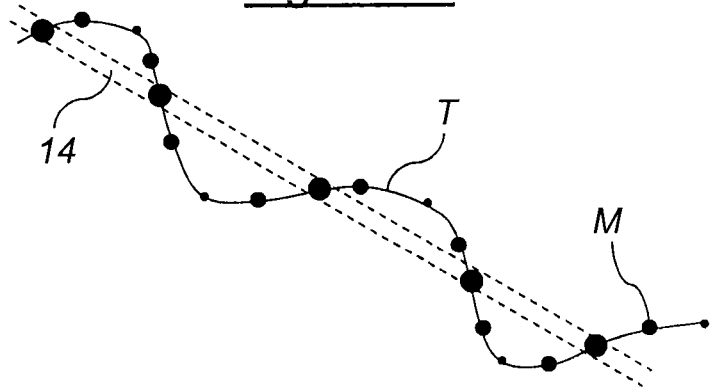
FIG. 11 represents schematically the carrying out of a specific step of the defect locating method implemented by the installation of FIG. 7.

During a first step 200, the ship follows a path T constituted of successive transversal passages directly above the cable 14 along the segment of cable 14 selected, for example, along a boustrophedon course, particularly following step 108. During this path T, the device 60 takes a whole series of measurements M of the electromagnetic field H. This path T, punctuated with measurements M, is represented in FIG. 11. From these measurements are deduced successive values of the module |H| of the electromagnetic field and if necessary its vertical component |Hz|. In FIG. 11, it is the module |H| that is represented by points that increase in size as the value of |H| increases. Thus, the passage directly above the cable 14 may be detected, either by a local maximum of the module |H|, or by a local minimum of |Hz|, or by a correlation between local maxima and minima of the module |H| and |Hz|, in the succession of measurements M.

In this way, during a step 202, from the measurements M are deduced the passage points directly above the cable positioned along a straight line parallel to the x axis of FIG. 9. Thanks to the measurements M plotted at these passage points, it is possible to constitute a curve of points, along the segment of cable 14 selected, for which a value of the module |H| of the electromagnetic field is known. As indicated previously with reference to FIG. 9 (right hand curve), this curve of points, if necessary interpolated, has an inflexion point directly above the defect 26.

This inflexion point is determined by the computer 74 according to a conventional method that will not be detailed, during a step 204.

Finally, during a final step 206, an estimation of the position of the defect 26 in the cable 14 is returned, as a function of the determined inflexion point.

In an alternative, it will be noted that it is possible to do without step 200, consisting in following a path along a boustrophedon course, if the exact position of the cable is well known and if one is capable of following a path directly along the cable and directly above it. In this case, during step 202, measurements of the module |H| are directly plotted, directly above the cable, while following it over the length of the segment of cable 14 selected to obtain the curve of points represented in FIG. 9 (right hand curve).

Those skilled in the art will note that the second aspect of the invention is independent of the first, in so far as it is possible to carry out a location by studying the electromagnetic field in accordance with this second aspect without having previously carried out a pre-location, particularly when one already has a priori an approximate knowledge of the spot where the defect is located, or having carried out a pre-location different from that described in accordance with the first aspect of the invention.

It appears clearly that a method such as that described previously according to several aspects, alternatives and embodiments, makes it possible to ensure a precise measurement of the location in an electric cable, or a series of electric cables, of a defect generating at least partial reflection of an incident electric signal.

It will also be noted that the invention is not restricted to the embodiments described and illustrated. It is particularly susceptible to various alternatives, as to the electrical energy transmission installation to which it applies or to the model of the variation of propagation speed used, whether this model is deduced from measurements and/or an analytical study and/or a numerical analysis.

APPENDIX

TABLE 1

| measurement from the Sangatte end 18 | | |
|---|---|---|
| L (in m) | $\theta_0$ (in µs) | $\theta_{10\%}$ (in µs) |
| 0.000 | 0 | 0 |
| 0.400 | 5.20 | Rapid rise of the signal |
| 0.800 | 10.43 | 10.65 |
| 1.200 | 15.68 | 16.05 |
| 1.600 | 20.95 | 21.47 |
| 2.000 | 26.24 | 26.92 |
| 2.400 | 31.54 | 32.37 |
| 2.800 | 36.86 | 37.84 |
| 3.200 | 42.19 | 43.31 |
| 3.600 | 47.54 | 48.79 |
| 4.000 | 52.88 | 54.28 |
| 4.400 | 58.21 | 59.77 |
| 4.800 | 63.58 | 65.26 |
| 5.200 | 68.94 | 70.76 |
| 5.600 | 74.32 | 76.26 |
| 6.000 | 79.7 | 81.76 |
| 6.400 | 85.08 | 87.27 |
| 6.800 | 90.47 | 92.78 |
| 7.200 | 95.88 | 98.29 |
| 7.600 | 101.27 | 103.81 |
| 8.000 | 106.65 | 109.33 |
| 8.400 | 112.05 | 114.84 |
| 8.800 | 117.45 | 120.36 |
| 9.200 | 122.84 | 125.88 |
| 9.600 | 128.23 | 131.41 |
| 10.000 | 133.67 | 136.93 |
| 10.400 | 139.09 | 142.38 |
| 10.800 | 144.50 | 147.94 |
| 11.200 | 149.93 | 153.52 |
| 11.600 | 155.32 | 159.06 |
| 12.000 | 160.77 | 164.60 |
| 12.400 | 166.21 | 170.13 |
| 12.800 | 171.65 | 175.67 |
| 13.200 | 177.10 | 181.21 |
| 13.600 | 182.52 | 186.76 |
| 14.000 | 187.96 | 192.30 |
| 14.400 | 193.44 | 197.85 |
| 14.800 | 198.87 | 203.39 |
| 15.200 | 204.35 | 208.94 |
| 15.600 | 209.79 | 214.49 |
| 16.000 | 215.28 | 220.03 |

TABLE 1-continued

| measurement from the Sangatte end 18 | | |
|---|---|---|
| L (in m) | $\theta_0$ (in µs) | $\theta_{10\%}$ (in µs) |
| 16.400 | 220.69 | 225.60 |
| 16.800 | 226.14 | 231.15 |
| 17.200 | 231.58 | 236.71 |
| 17.600 | 237.03 | 242.26 |
| 18.000 | 242.52 | 247.82 |
| 18.400 | 247.97 | 253.38 |
| 18.800 | 253.43 | 258.95 |
| 19.200 | 258.89 | 264.51 |
| 19.600 | 264.40 | 270.07 |
| 20.000 | 269.83 | 275.64 |
| 20.400 | 275.30 | 281.21 |
| 20.800 | 280.77 | 286.77 |
| 21.200 | 286.25 | 292.34 |
| 21.600 | 291.73 | 297.91 |
| 22.000 | 297.17 | 303.48 |
| 22.400 | 302.62 | 309.05 |
| 22.800 | 308.10 | 314.63 |
| 23.200 | 313.55 | 320.20 |
| 23.600 | 319.00 | 325.78 |
| 24.000 | 324.45 | 331.35 |
| 24.400 | 329.95 | 336.55 |
| 24.800 | 335.45 | 342.51 |
| 25.200 | 340.90 | 348.09 |
| 25.600 | 346.41 | 353.67 |
| 26.000 | 351.87 | 359.26 |
| 26.400 | 357.38 | 364.84 |
| 26.800 | 362.84 | 370.42 |
| 27.200 | 368.36 | 376.01 |
| 27.600 | 373.88 | 381.59 |
| 28.000 | 379.35 | 387.18 |
| 28.400 | 384.82 | 392.77 |
| 28.800 | 390.29 | 398.36 |
| 29.200 | 395.77 | 403.95 |
| 29.600 | 401.30 | 409.54 |
| 30.000 | 406.83 | 415.14 |
| 30.400 | 412.31 | 420.74 |
| 30.800 | 417.79 | 426.33 |
| 31.200 | 423.28 | 431.92 |
| 31.600 | 428.76 | 437.52 |
| 32.000 | 434.25 | 443.11 |
| 32.400 | 439.73 | 448.71 |
| 32.800 | 445.22 | 454.31 |
| 33.200 | 450.71 | 459.91 |
| 33.600 | 456.27 | 465.51 |
| 34.000 | 461.76 | 471.12 |
| 34.400 | 467.26 | 476.72 |
| 34.800 | 472.76 | 482.33 |
| 35.200 | 478.26 | 487.93 |
| 35.600 | 483.76 | 493.53 |
| 36.000 | 489.32 | 499.14 |
| 36.400 | 494.83 | 504.75 |
| 36.800 | 500.40 | 510.35 |
| 37.200 | 505.91 | 515.96 |
| 37.600 | 511.42 | 521.57 |
| 38.000 | 516.93 | 527.19 |
| 38.400 | 522.44 | 532.80 |
| 38.800 | 527.96 | 538.41 |
| 39.200 | 533.40 | 544.02 |
| 39.600 | 538.92 | 549.64 |
| 40.000 | 544.43 | 555.25 |
| 40.400 | 549.88 | 560.86 |
| 40.800 | 555.40 | 566.48 |
| 41.200 | 561.00 | 572.10 |
| 41.600 | 566.52 | 577.72 |
| 42.000 | 572.05 | 583.34 |
| 42.400 | 577.57 | 588.96 |
| 42.800 | 583.10 | 594.58 |
| 43.200 | 588.63 | 600.20 |
| 43.600 | 594.16 | 605.82 |
| 44.000 | 599.61 | 611.44 |
| 44.400 | 605.15 | 617.07 |
| 44.800 | 610.68 | 622.69 |
| 45.200 | 616.22 | 628.31 |
| 45.600 | 621.76 | 633.94 |
| 46.000 | 627.30 | 639.56 |
| 46.400 | 632.84 | 645.19 |

TABLE 1-continued measurement from the Sangatte end 18

| L (in m) | $\theta_0$ (in µs) | $\theta_{10\%}$ (in µs) |
|---|---|---|
| 46.800 | 638.38 | 650.82 |
| 47.200 | 643.92 | 656.45 |
| 47.600 | 649.47 | 662.08 |
| 48.000 | 655.02 | 667.70 |

TABLE 2 measurement from the Sellindge end 16

| L (in m) | $\theta_0$ (in µs) | $\theta_{10\%}$ (in µs) |
|---|---|---|
| 0.000 | 245.35 | — |
| 0.400 | 251.06 | 263.22 |
| 0.800 | 256.68 | 270.26 |
| 1.200 | 262.35 | 276.47 |
| 1.600 | 268.00 | 282.09 |
| 2.000 | 273.62 | 287.43 |
| 2.400 | 279.22 | 292.66 |
| 2.800 | 284.75 | 297.85 |
| 3.200 | 290.37 | 303.11 |
| 3.600 | 295.81 | 308.39 |
| 4.000 | 301.40 | 313.76 |
| 4.400 | 306.97 | 319.20 |
| 4.800 | 312.45 | 324.70 |
| 5.200 | 318.03 | 330.22 |
| 5.600 | 323.57 | 335.75 |
| 6.000 | 329.07 | 341.32 |
| 6.400 | 334.63 | 346.92 |
| 6.800 | 340.19 | 352.53 |
| 7.200 | 345.75 | 358.14 |
| 7.600 | 351.27 | 363.75 |
| 8.000 | 356.80 | 369.41 |
| 8.400 | 362.38 | 375.04 |
| 8.800 | 367.87 | 380.68 |
| 9.200 | 373.41 | 386.33 |
| 9.600 | 379.01 | 391.97 |
| 10.000 | 384.51 | 397.64 |
| 10.400 | 390.01 | 403.26 |
| 10.800 | 395.57 | 408.89 |
| 11.200 | 401.18 | 414.52 |
| 11.600 | 406.75 | 420.16 |
| 12.000 | 412.27 | 425.80 |
| 12.400 | 417.73 | 431.45 |
| 12.800 | 423.25 | 437.08 |
| 13.200 | 428.78 | 442.73 |
| 13.600 | 434.31 | 448.38 |
| 14.000 | 439.84 | 454.02 |
| 14.400 | 445.43 | 459.67 |
| 14.800 | 450.97 | 465.33 |
| 15.200 | 456.51 | 470.98 |
| 15.600 | 462.05 | 476.63 |
| 16.000 | 467.54 | 482.29 |
| 16.400 | 473.15 | 487.94 |
| 16.800 | 478.70 | 493.60 |
| 17.200 | 484.26 | 499.26 |
| 17.600 | 489.75 | 504.88 |
| 18.000 | 495.31 | 510.57 |
| 18.400 | 500.86 | 516.23 |
| 18.800 | 506.44 | 521.90 |
| 19.200 | 512.01 | 527.56 |
| 19.600 | 517.52 | 533.23 |
| 20.000 | 523.09 | 538.87 |
| 20.400 | 528.53 | 544.52 |
| 20.800 | 534.03 | 550.22 |
| 21.200 | 539.54 | 555.89 |
| 21.600 | 545.13 | 561.56 |
| 22.000 | 550.64 | 567.22 |
| 22.400 | 556.23 | 572.85 |
| 22.800 | 561.75 | 578.60 |
| 23.200 | 567.26 | 584.23 |
| 23.600 | 572.78 | 589.90 |
| 24.000 | 578.30 | 595.57 |
| 24.400 | 583.83 | 601.25 |

TABLE 2-continued measurement from the Sellindge end 16

| L (in m) | $\theta_0$ (in µs) | $\theta_{10\%}$ (in µs) |
|---|---|---|
| 24.800 | 589.35 | 606.91 |
| 25.200 | 594.96 | 612.60 |
| 25.600 | 600.49 | 618.24 |
| 26.000 | 606.01 | 623.95 |
| 26.400 | 611.54 | 629.62 |
| 26.800 | 617.08 | 635.30 |
| 27.200 | 622.61 | 640.93 |
| 27.600 | 628.15 | 646.61 |
| 28.000 | 633.68 | 652.28 |
| 28.400 | 639.22 | 657.97 |
| 28.800 | 644.76 | 663.55 |
| 29.200 | 650.39 | 669.24 |
| 29.600 | 656.02 | 674.92 |
| 30.000 | 661.57 | 680.57 |
| 30.400 | 667.12 | 686.24 |
| 30.800 | 672.57 | 691.91 |
| 31.200 | 678.12 | 697.61 |
| 31.600 | 683.67 | 703.28 |
| 32.000 | 689.13 | 708.95 |
| 32.400 | 694.69 | 714.60 |
| 32.800 | 700.24 | 720.33 |
| 33.200 | 705.89 | 726.00 |
| 33.600 | 711.45 | 731.62 |
| 34.000 | 717.01 | 737.27 |
| 34.400 | 722.57 | 742.97 |
| 34.800 | 728.04 | 748.69 |
| 35.200 | 733.60 | 754.33 |
| 35.600 | 739.07 | 760.05 |
| 36.000 | 744.63 | 765.73 |
| 36.400 | 750.10 | 771.41 |
| 36.800 | 755.67 | 777.12 |
| 37.200 | 761.13 | 782.81 |
| 37.600 | 766.70 | 788.38 |
| 38.000 | 772.27 | 794.15 |
| 38.400 | 777.85 | 799.69 |
| 38.800 | 783.42 | 805.38 |
| 39.200 | 789.00 | 811.05 |
| 39.600 | 794.58 | 816.74 |
| 40.000 | 800.16 | 822.42 |
| 40.400 | 805.63 | 828.08 |
| 40.800 | 811.21 | 833.82 |
| 41.200 | 816.68 | 839.43 |
| 41.600 | 822.16 | 845.12 |
| 42.000 | 827.74 | 850.79 |
| 42.400 | 833.21 | 856.47 |
| 42.800 | 838.69 | 862.17 |
| 43.200 | 844.28 | 867.84 |
| 43.600 | 849.75 | 873.54 |
| 44.000 | 855.22 | 879.23 |
| 44.400 | 860.81 | 884.90 |
| 44.800 | 866.29 | 890.60 |
| 45.200 | 871.88 | 896.34 |
| 45.600 | 877.48 | 901.97 |
| 46.000 | 882.95 | 907.65 |
| 46.400 | 888.55 | 913.40 |
| 46.800 | 894.15 | 919.14 |
| 47.200 | 899.63 | 924.67 |
| 47.600 | 905.23 | 930.41 |
| 48.000 | 910.70 | 936.10 |

The invention claimed is:

1. A method for locating a defect in an electric link, comprising:
   measuring a magnitude of at least one scalar component of a vectorial electromagnetic field in a vicinity of an estimated location of the defect at plural places along the link;
   deducing, via a processor, from the measuring, an estimation of variation of the magnitude of the at least one scalar component of the vectorial electromagnetic field along the electric link in the vicinity of the estimated location of the defect; and estimating, via the processor, a new estimated location of the defect as a function of the estimated variation of the magnitude of the at least one scalar component of the vectorial electromagnetic field, wherein:
the measuring includes measuring, by a system with three mutually orthogonal coils, a complete module of the vectorial electromagnetic field in the vicinity of the estimated location of the defect at the plural places along the link;
the deducing includes deducing, via the processor, from the measuring, the estimation of the variation of the complete module of the vectorial electromagnetic field along the electric link in the vicinity of the estimated location of the defect; and
the estimating includes estimating, via the processor, the new estimated location of the defect as a function of detection of an inflexion point in the estimated variation of the complete module of the vectorial electromagnetic field along the link.

2. The method for locating a defect in an electric link as claimed in claim 1, wherein the measurements, at the plural places along the link, of the magnitude of the at least one scalar component of the vectorial electromagnetic field, are carried out along a path including successive transversal passages directly above the link.

3. The method for locating a defect in an electric link as claimed in claim 2, wherein the path that includes successive transversal passages directly above the link follows a boustrophedon course.

4. The method for locating a defect in an electric link as claimed in claim 2, wherein the vectorial electromagnetic field is generated by a flow in the electric link of a current of predetermined frequency, and wherein the measured magnitude of the at least one scalar component of the vectorial electromagnetic field is filtered by a band-pass filtering system regulated around the predetermined frequency of the current.

5. The method for locating a defect in an electric link as claimed in claim 1, further comprising, prior to the measuring, the deducing and the estimating:
transmitting, at a first moment, an electric signal having a predetermined propagation speed at a start from an end of the electric link;
detecting, at a second moment, reception of an echo of the electric signal;
establishing a model of variation of the electric signal and its echo propagation speed in the electric link as a function of a length of electric link through which the transmitted electric signal and its echo have flowed; and
defining the estimated location of the defect as a function of the difference between the first and second moments, of the predetermined propagation speed at the start, and of the speed variation model in the link,
wherein the model includes a plurality of propagation speeds of the transmitted electric signal and its echo, the plurality of propagation speeds corresponding to a plurality of lengths of the electric link through which the transmitted electric signal and its echo have flowed, and the plurality of lengths of the electric link including lengths of the electric link shorter than a total length of the electric link.

6. A device for locating a defect in an electric link, comprising:
a measuring device for measuring a magnitude of at least one scalar component of a vectorial electromagnetic field in a vicinity of an estimated location of the defect at plural places along the link; and
a processor which deduces from the measuring output from the measuring device an estimation of variation of the magnitude of the at least one scalar component of the vectorial electromagnetic field along the electric link in the vicinity of the estimated location of the defect; and which estimates a new estimated location of the defect as a function of the estimated variation of the magnitude of the at least one scalar component of the vectorial electromagnetic field,
wherein the measuring device includes three mutually orthogonal coils for measuring three orthogonal components of the vectorial electromagnetic field, and wherein the processor is programmed for estimating the variation of at least one part of the three orthogonal components of the vectorial electromagnetic field along the link and estimating the new estimated location of the defect as a function of the estimated variation of at least one part of the three orthogonal components of the vectorial electromagnetic field.

* * * * *

UNITED STATES PATENT AND TRADEMARK OFFICE
CERTIFICATE OF CORRECTION

PATENT NO.       : 9,081,047 B2                                    Page 1 of 1
APPLICATION NO.  : 14/013764
DATED            : July 14, 2015
INVENTOR(S)      : Matthieu Surdon et al.

It is certified that error appears in the above-identified patent and that said Letters Patent is hereby corrected as shown below:

On the title page, Item (30), the Foreign Application Priority Data Information has been omitted. Item (30) should read:

--(30)        Foreign Application Priority Data

Mar. 7, 2008     (EPO).................................08290221.4--

Signed and Sealed this
Fifth Day of January, 2016

Michelle K. Lee
*Director of the United States Patent and Trademark Office*